(12) United States Patent
Nayler

(10) Patent No.: US 7,372,337 B2
(45) Date of Patent: May 13, 2008

(54) VOLTAGE CONTROLLED OSCILLATOR COMPRISING AN INJECTION PULLING COMPENSATION CIRCUIT

(75) Inventor: Peter Nayler, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 46 days.

(21) Appl. No.: 10/531,514

(22) PCT Filed: Oct. 14, 2003

(86) PCT No.: PCT/FR03/03020

§ 371 (c)(1),
(2), (4) Date: Feb. 22, 2006

(87) PCT Pub. No.: WO2004/038909

PCT Pub. Date: May 6, 2004

(65) Prior Publication Data

US 2006/0202767 A1    Sep. 14, 2006

(30) Foreign Application Priority Data

Oct. 18, 2002   (FR) .................................. 02 12959

(51) Int. Cl.
*H03L 7/00* (2006.01)
(52) U.S. Cl. ..................... 331/16; 331/10; 331/23; 327/156; 332/127

(58) Field of Classification Search ............... 331/16, 331/10, 23; 332/127; 327/156
See application file for complete search history.

(56) References Cited

U.S. PATENT DOCUMENTS

| 5,144,260 A | 9/1992 | Stribling et al. ............ 331/10 |
| 6,016,082 A * | 1/2000 | Cruz et al. ............ 331/117 FE |
| 6,281,758 B1 | 8/2001 | Elsayed et al. ............ 331/16 |
| 6,321,074 B1 | 11/2001 | Lemay ............ 455/260 |
| 6,424,230 B1 | 7/2002 | Kocaman et al. ............ 331/15 |

* cited by examiner

*Primary Examiner*—Benny Lee
*Assistant Examiner*—Levi Gannon
(74) *Attorney, Agent, or Firm*—Lisa K. Jorgenson; Dennis M. de Guzman; Seed IP Law Group PLLC

(57) ABSTRACT

The present invention relates to a method for stabilising the operation of a voltage controlled oscillator driven by a phase locked loop, the voltage controlled oscillator delivering an RF signal and receiving through at least one spurious path a harmonic component of a frequency equal or proximate to that of the RF signal, capable of disturbing its operation by injection pulling. According to the present invention, the method comprises a step of injecting into the voltage controlled oscillator an injection pulling compensation signal, the phase and the amplitude of which are adjusted so as to neutralise the effects of the spurious harmonic component. Application particularly to phase modulation IQ circuits in radiotelephony.

47 Claims, 8 Drawing Sheets

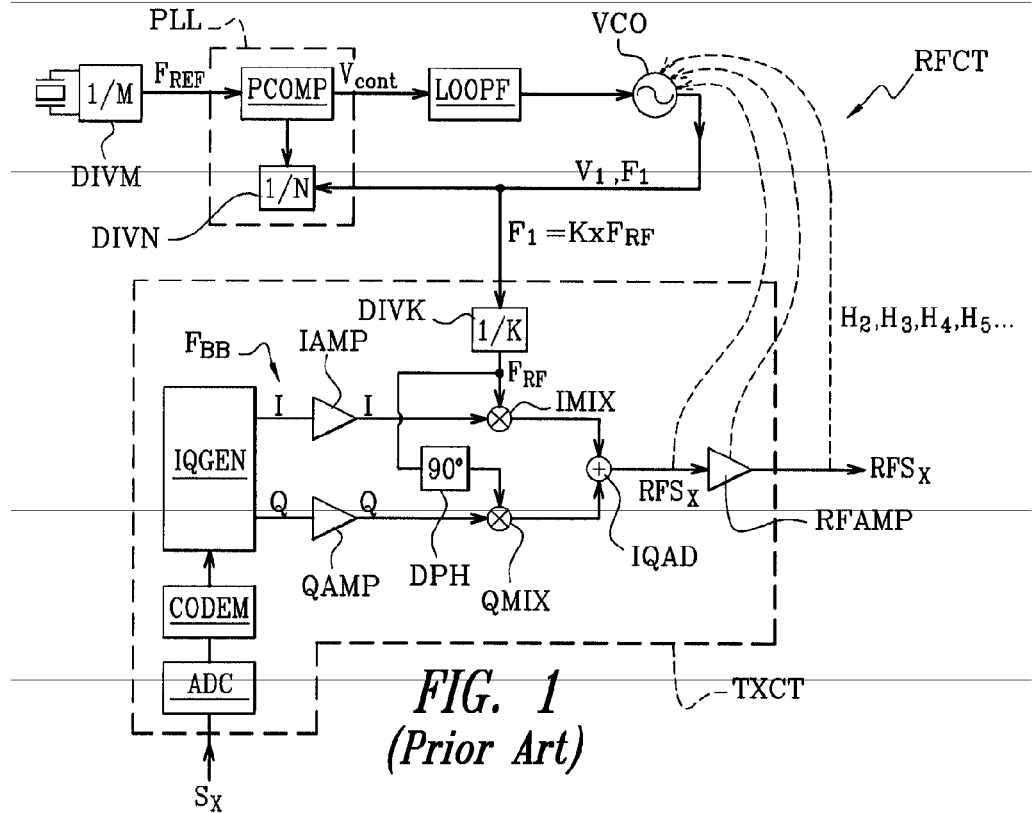
FIG. 1
*(Prior Art)*
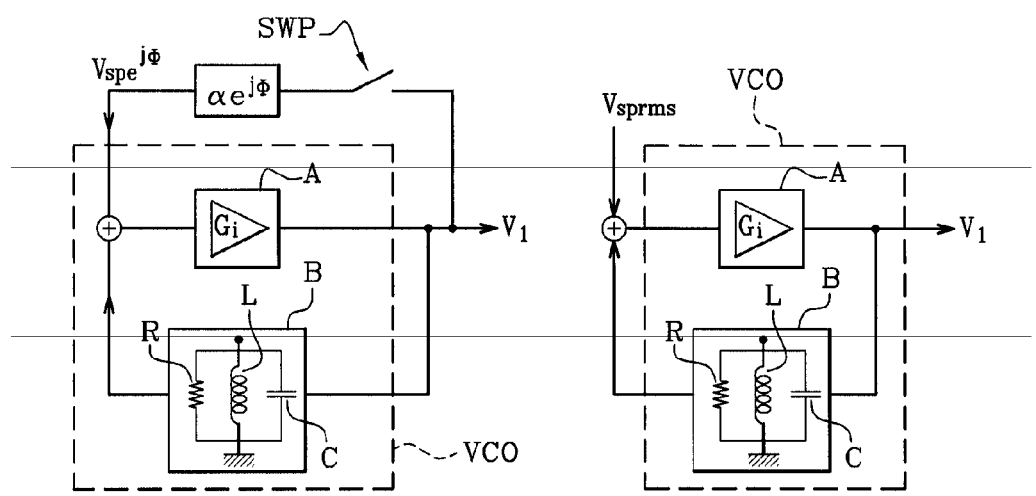
FIG. 2A
*(Prior Art)*
FIG. 2B
*(Prior Art)*

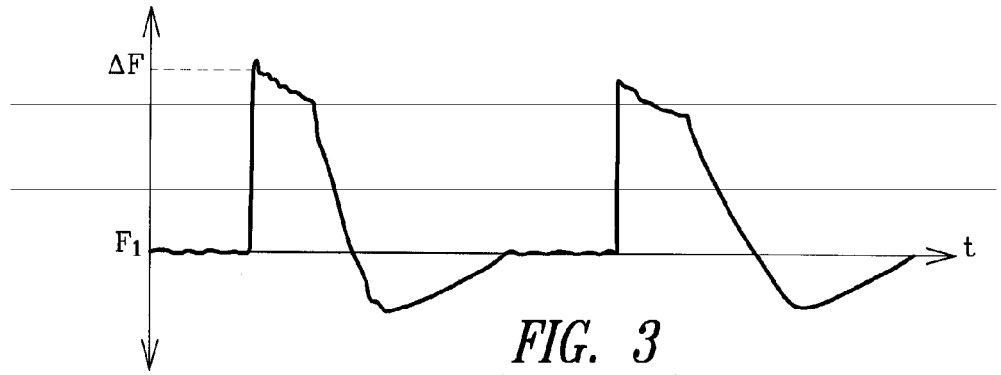
FIG. 3
*(Prior Art)*
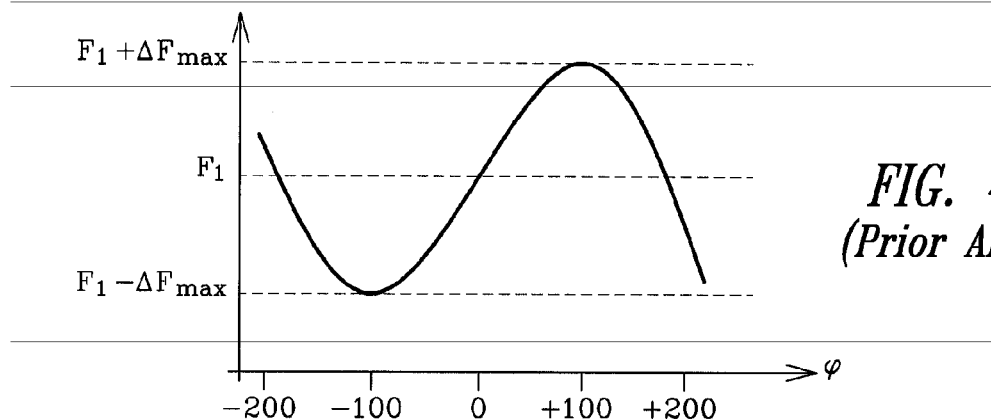
FIG. 4
*(Prior Art)*
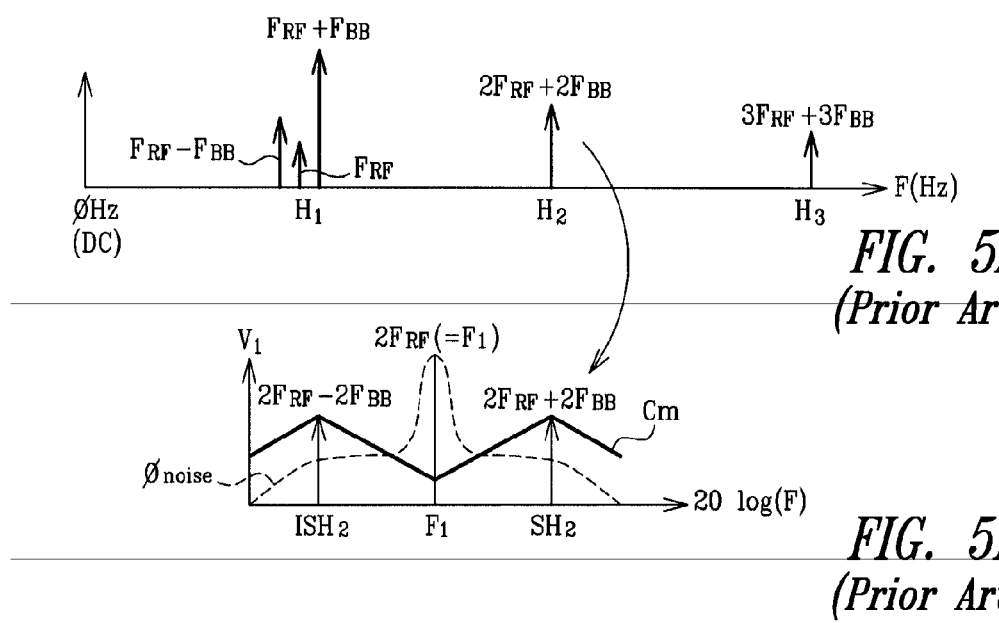
FIG. 5A
*(Prior Art)*
FIG. 5B
*(Prior Art)*

VOLTAGE CONTROLLED OSCILLATOR COMPRISING AN INJECTION PULLING COMPENSATION CIRCUIT

BACKGROUND OF THE INVENTION

1. Field of the Invention

The present invention relates to voltage controlled oscillators or VCOs.

The present invention relates more particularly to an RF circuit comprising a voltage controlled oscillator delivering an RF signal, a phase locked loop to control the voltage controlled oscillator, a modulation circuit receiving the RF signal and delivering a modulated signal comprising at least one RF harmonic component capable of disturbing the voltage controlled oscillator by injection pulling.

2. Description of the Related Art

In radio frequency circuits using VCOs, the performances of the VCOs are deteriorated by leaks of harmonic signals, due to "injection pulling" also known as "injection locking".

The present invention aims to remove, or at least to reduce, the injection pulling in the VCOs.

For a better understanding, FIG. 1 shows a classical application of a VCO in the area of radiotelephony. In this Figure a circuit RFCT comprising a VCO, a circuit forming a phase locked loop or PLL circuit and a modulation circuit TXCT can be distinguished.

The VCO delivers to the modulation circuit TXCT a voltage V1 the frequency F1 of which is controlled by the PLL circuit. For that purpose, the PLL circuit comprises a divide-by-N frequency divider DIVN that receives the voltage V1 at input and that delivers a signal of frequency F1/N to one input of a phase comparator PCOMP. The phase comparator receives a reference frequency $F_{REF}$ at another input. This frequency $F_{REF}$ is, for example, delivered by a divide-by-M divider DIVM the input of which is linked to a quartz oscillator. The output of the comparator delivers a control signal Vcont that is applied to one control input of the VCO through a loop filter LOOPF having a determined bandwidth. The signal V1 is therefore frequency and phase controlled and its frequency F1 is equal to $N/M*F_{REF}$.

Here the circuit TXCT is a data transmission circuit by phase modulation IQ (quadrature modulation PM) provided for a mobile telephone for example.

The circuit TXCT receives an analog signal Sx and the signal V1 from the VCO at input, and delivers a signal RFSx intended to be applied to an RF antenna, that is phase modulated by means of two quadrature signals I and Q.

The circuit TXCT comprises a divide-by-K divider DIVK the input of which receives the signal V1 and the output of which delivers a modulation PM carrier $F_{RF}$, $F_{RF}$ being equal to F1/K, K generally being equal to 2 or to 4. The signal Sx is digitised by a converter ADC, then it is applied to an encoder modem CODEM then is applied again to a processor IQGEN. The processor IQGEN delivers, in a baseband of frequency $F_{BB}$, phase I and quadrature Q signals. The signal I is applied to one input of a mixer IMIX through an amplifier IAMP, and the signal Q applied to one input of a mixer QMIX through an amplifier QAMP. The mixer IMIX receives the carrier $F_{RF}$ at another input and the mixer QMIX receives the carrier $F_{RF}$ phase-shifted by 90° at another input, delivered by a phase shifter DPH. The outputs of the mixers IMIX, QMIX are applied to an adder IQAD that delivers the modulated signal RFSx. The signal RFSx is applied to an output amplifier RFAMP the output of which forms the output of the transmission circuit TXCT.

The signal Sx generally contains data to be transmitted, such as a coded voice for example, and has a spectrum of frequencies representative of the modulation schema provided for by the standard implemented (such as GMSK in GSM for example). Considering, as an example, that the signal Sx is a single tone, the circuit IQGEN then delivers two pure quadrature sine curves I=cos ($F_{BB}$) and Q=sin ($F_{BB}$). The result of the phase modulation IQ is, in this case, a single tone of frequency $F_{RF}+F_{BB}$ the image component $F_{RF}-F_{BB}$ of which is removed by the quadrature modulation, and the carrier $F_{RF}$ of which is also removed.

Due to imperfections in the modulation circuit, or "non-linearity", the output signal comprises in addition to the wanted component H1 of frequency $F_{RF}+F_{BB}$, harmonics H2, H3, H4, . . . . At least one of these components is proximate to the oscillation frequency F1 of the VCO. It is the first harmonic H1 (wanted component) when the divider DIVK does not exist or has a division value equal to 1 (K=1), the second harmonic H2 when the divider DIVK is a divide-by-2 divider (K=2) or the fourth harmonic H4 when the divider DIVK is a divide-by-4 divider (K=4). When K=2, the frequency of the second harmonic H2 is in fact equal to $2F_{RF}+2F_{BB}$ (i.e., $F1+2F_{BB}$) and is very proximate to the center frequency F1 of the VCO as the frequency of the baseband $F_{BB}$ is low before the carrier $F_{RF}$, generally in the order of a few Gigahertz. Similarly, when K=4, the fourth harmonic H4 has a frequency of $4F_{RF}+4F_{BB}$ (i.e., $F1+4F_{BB}$) that is proximate to the center frequency of the VCO.

It is well known that the involuntary injection of this harmonic component into the core of the VCO, by various spurious paths, deteriorates the performances of the VCO.

Various methods are known to overcome this disadvantage.

One known method involves producing the VCO on a substrate distinct from the one bearing the phase modulation IQ circuit TXCT. This substrate is arranged in a sheathed case and comprises means for connecting to the circuit TXCT that are equipped with insulating barriers preventing the spurious harmonics sent by the circuit TXCT from "rising" to the core of the VCO. These barriers generally comprise filters, "balun" type connectors, insulators, buffer circuits . . . and must be provided in all the conduction paths linking the VCO to the circuit TXCT, including the power supply paths. This solution is however complex to implement and increases the cost price of the RF circuits, which is passed on at the end of the chain to the selling price of the mobile telephones.

Other methods are based on providing a phase modulation IQ circuit architecture in which the VCO is quite insensitive to the spurious harmonics.

Therefore, the heterodyne systems use several VCOs and several cascade-arranged mixers, and a premodulation stage using an intermediate frequency IF. In the output stage, the frequency of the modulated signal is clearly offset in relation to the natural frequency of the VCO, and the harmonics capable of interfering with the VCO are harmonics and/or mixing products of high rank that are greatly attenuated.

However, the disadvantage of the heterodyne systems is that they require the use of at least two VCOs, as well as additional mixers and filters, and are therefore costly and bulky.

Another solution to counter the injection pulling includes providing a copy loop in the VCO. This copy loop allows harmonic frequencies to be obtained that are offset in relation to the center frequency of the VCO, and are located outside its bandwidth (determined by the loop filter). However, this solution also requires using several VCOs, generally three VCOs at least.

Various architectures of RF modulation circuits or of VCOs that are quite insensitive to injection pulling are described particularly in U.S. Pat. Nos. 6,321,1074, 5,144,260 and 6,281,758.

BRIEF SUMMARY OF THE INVENTION

The present invention aims to provide a quite different method for removing or limiting the injection pulling in the VCOs, that is simple and inexpensive to implement, and that can provide good results in a modulation circuit that only uses a single VCO, whether it is a phase modulation IQ circuit or an amplitude modulation circuit or even a phase and amplitude modulation circuit.

To achieve this object, the present invention is based on an in-depth study of the disturbance mechanisms occurring in a VCO, that will be described below. At the end of this study, and as it will be seen in greater detail subsequently, the conclusion could be drawn that the injection pulling is attributable to the injection into the VCO of a spurious harmonic that passes along many spurious paths each having their own transfer function, thus forming a plurality of spurious signals. These spurious signals are added to each other and there is a single resulting spurious signal that is the result of the vector sum of the spurious signals.

The conclusion could also be drawn that the resulting spurious signal is the sole cause of all the forms of disturbance attributable to the injection pulling, and that by removing it, or at least attenuating it as far as possible, the injection pulling can be removed, or at least reduced sufficiently with regard to the expected specifications of an RF modulation circuit.

Therefore, the principle of the present invention is to voluntarily inject into a VCO a spurious signal that has the same amplitude as the resulting spurious signal injected involuntarily but which is in opposite phase with the latter, such that the vector sum of the resulting spurious signal injected involuntarily and of the spurious signal injected voluntarily is equal to 0. This spurious signal injected voluntarily forms a compensation signal according to the present invention that neutralises the injection pulling in a VCO.

Another principle of the present invention is to generate the compensation signal by taking off the disturbing harmonic in the modulation circuit itself, at a point rich in harmonics, then by applying this harmonic to a phase and amplitude control circuit so as to deliver the compensation signal.

More particularly, the present invention relates to a method for stabilising the operation of a voltage controlled oscillator driven by a phase locked loop, the voltage controlled oscillator delivering an RF signal and receiving through at least one spurious path a harmonic component of a frequency equal or proximate to that of the RF signal sent, capable of disturbing the operation of the voltage controlled oscillator by injection pulling, comprising the injection, into the voltage controlled oscillator, of an injection pulling compensation signal, the phase and the amplitude of which are adjusted so as to neutralise the disturbing effects of the harmonic component.

According to one embodiment, the compensation signal is amplitude and phase adjusted so as to have an amplitude substantially equal to the amplitude of a spurious signal resulting from the involuntary injection into the voltage controlled oscillator, by at least one spurious path, of the disturbing harmonic component, and a phase opposite that of the spurious signal.

According to one embodiment, the method comprises the single ended injection, at one point of the voltage controlled oscillator, of a compensation signal having a unique component.

According to one embodiment, the method comprises the injection of a compensation signal having two components, and the single ended injection of these components at two different points of the voltage controlled oscillator.

According to one embodiment, the method comprises the injection of a compensation signal having two components in opposite phase, and the injection of these two components at two different points of the voltage controlled oscillator.

According to one embodiment, the compensation signal is generated from at least one harmonic component taken off in the modulation circuit.

According to one embodiment, the compensation signal is generated from at least one harmonic component taken off in an amplifier of a modulation circuit from which the disturbing harmonic component is sent.

According to one embodiment, the compensation signal is generated from one harmonic component produced by a harmonic generating circuit.

According to one embodiment, the phase of the compensation signal is adjusted by means of a phase-shift circuit.

According to one embodiment, the amplitude of the compensation signal is adjusted by means of an attenuator circuit comprising adjustable resistors or capacitors or a combination of these elements.

According to one embodiment, the amplitude and the phase of the compensation signal are adjusted by means of a group of at least two attenuator circuits the outputs of which are added up.

According to one embodiment, the amplitude and the phase of the compensation signal are adjusted by means of a group of attenuator circuits having their outputs added up and receiving at input phase quadrature signals coming from the disturbing harmonic component.

According to one embodiment, the amplitude and the phase of the compensation signal are adjusted by means of a group of attenuator circuits having their outputs added up and receiving at input phase quadrature and opposite phase signals coming from the disturbing harmonic component.

According to one embodiment, the phase quadrature and opposite phase signals are generated by means of a phase-shift circuit comprising a balanced bridge of resistors and capacitors that is quite insensitive to the temperature.

According to one embodiment, an attenuator circuit comprises electrically adjustable capacitors or electrically adjustable resistors that are adjusted by analog signals coming from adjustment digital data.

According to one embodiment, the adjustment digital data are stored in memory cells.

According to one embodiment, the compensation signal is injected onto one terminal of an active component of the voltage controlled oscillator.

According to one embodiment, the compensation signal is injected onto one terminal of a passive component of the voltage controlled oscillator.

According to one embodiment, the compensation signal is injected by inductive coupling.

The present invention also relates to an RF circuit comprising a voltage controlled oscillator delivering an RF signal, a phase locked loop to control the voltage controlled oscillator, a modulation circuit receiving the RF signal and delivering a modulated signal comprising at least one harmonic component of a frequency equal or proximate to that of the RF signal delivered by the voltage controlled oscillator, the harmonic component being capable of disturbing the operation of the voltage controlled oscillator by injection pulling, the RF circuit comprising an injection pulling compensation circuit comprising one input receiving at least the disturbing harmonic component and means for modifying the phase and the amplitude of the harmonic component to deliver an injection pulling compensation signal, and means for injecting the compensation signal into the voltage controlled oscillator.

According to one embodiment, the compensation circuit is amplitude and phase adjusted such that the compensation signal injected into the voltage controlled oscillator has an amplitude substantially equal to the amplitude of a spurious signal resulting from the involuntary injection into the voltage controlled oscillator, by at least one spurious path, of the disturbing harmonic component, and a phase opposite that of the spurious signal.

According to one embodiment, the compensation circuit is a single ended circuit that delivers a compensation signal having a unique component that is injected at one point of the voltage controlled oscillator.

According to one embodiment, the compensation circuit is a single ended circuit that delivers a compensation signal having two components that are injected at two different points of the voltage controlled oscillator.

According to one embodiment, the compensation circuit is a balanced circuit that delivers a compensation signal having two components in opposite phase that are injected at two different points of the voltage controlled oscillator.

According to one embodiment, the compensation circuit receives at input a harmonic component taken off in the modulation circuit.

According to one embodiment, the compensation circuit receives at input a harmonic component taken off in an output amplifier of the modulation circuit.

According to one embodiment, the compensation circuit receives at input a harmonic component delivered by a harmonic generating circuit distinct from the modulation circuit.

According to one embodiment, the compensation circuit comprises a phase-shift circuit to modify the phase of the harmonic component received at input.

According to one embodiment, the compensation circuit comprises a phase-shift circuit receiving the disturbing harmonic component and delivering two phase quadrature signals.

According to one embodiment, the compensation circuit comprises a phase-shift circuit receiving the disturbing harmonic component and delivering phase quadrature and opposite phase signals.

According to one embodiment, the phase-shift circuit comprises a balanced bridge of resistors and capacitors that is quite insensitive to the temperature.

According to one embodiment, the compensation circuit comprises at least one attenuator circuit to modify the amplitude of the harmonic component received at input.

According to one embodiment, the attenuator circuit comprises adjustable resistors or capacitors or a combination of these elements.

According to one embodiment, the RF circuit comprises a group of at least two attenuator circuits the outputs of which are added up to control the phase and the amplitude of the compensation signal.

According to one embodiment, the RF circuit comprises a group of attenuator circuits having their outputs added up and receiving at input phase quadrature signals coming from the disturbing harmonic component.

According to one embodiment, the RF circuit comprises a group of attenuator circuits having their outputs added up and receiving at input phase quadrature and opposite phase signals coming from the disturbing harmonic component.

According to one embodiment, an attenuator circuit comprises electrically adjustable capacitors or electrically adjustable resistors, which are adjusted by analog signals delivered by a digital to analog converter.

According to one embodiment, digital data for adjusting the capacitors of the attenuator circuit are stored in memory cells and are applied to the digital to analog converter.

According to one embodiment, the compensation signal is injected, onto one terminal of an active component of the voltage controlled oscillator.

According to one embodiment, the compensation signal is injected onto one terminal of a passive component of the voltage controlled oscillator.

According to one embodiment, the means for injecting the compensation signal comprise an injection inductor coupled to an inductor of the voltage controlled oscillator.

BRIEF DESCRIPTION OF THE SEVERAL VIEWS OF THE DRAWINGS

These and other objects, features and advantages of the present invention will be explained in greater detail in the following description of the method according to the present invention and of various examples of embodiments of compensation circuits according to the present invention, given in relation with, but not limited to, the following figures:

FIG. 1 represents a classical phase modulation IQ circuit comprising a voltage controlled oscillator, FIG. 2A is the diagram of a theoretical model of voltage controlled oscillator used to analyse a frequency jumping phenomenon, FIG. 2B is the diagram of a theoretical model of voltage controlled oscillator used to analyse a noise and spurious signal phenomenon, FIG. 3 represents frequency jumps occurring in a voltage controlled oscillator in the presence of a switched spurious signal, FIG. 4 represents the extent of the frequency jumps according to the phase of the spurious signal arriving in the core of the VCO, FIG. 5A represents the spectrum of frequencies of a signal delivered by the phase modulation IQ circuit in FIG. 1 when a quadrature sine-wave signal is applied to it at input, FIG. 5B represents the spectrum of frequencies of a signal present in the voltage controlled oscillator in FIG. 1, FIGS. 6A and 6B are vectorial representations schematically showing the appearance of an image frequency in the spectrum of frequencies represented in FIG. 5B.

DETAILED DESCRIPTION OF THE INVENTION

Figure 6A:
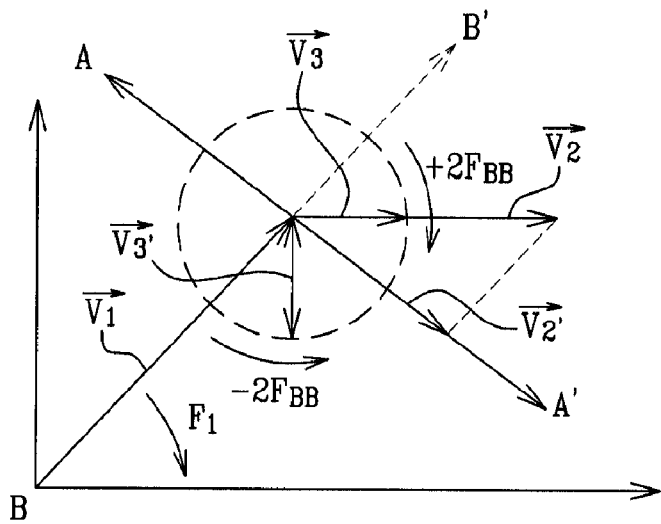

Experimental and Theoretical Bases of the Present Invention

As explained above, the principle of the present invention is to inject a compensation signal into a VCO that neutralises in phase and in amplitude a resulting spurious signal equal to the vector sum of the incident spurious signals coming from a harmonic component delivered by a modulation circuit.

Before describing examples of embodiments of compensation circuits enabling this compensation signal to be generated, various experimental observations, theoretical studies and hypotheses having led to the present invention will be succinctly described.

The deterioration caused by the injection pulling results in two distinct phenomena. Firstly, there is instantaneous frequency jumps in the VCO, and secondly a spurious modulation leading to a substantial phase error and spurious lines in the spectrum of frequencies of the VCO. It must be shown that these two phenomena have a single cause taking the form of a single spurious signal having a determined amplitude and phase, and that they are mutually correlated, in terms of phase and amplitude of the spurious signal that generates them.

Experimental observations of these two phenomena have been combined with theoretical studies and computer simulations.

In the following description, reference will be made to the example of a modulation circuit TXCT described in relation with FIG. 1. The coefficient K of the divider DIVK is taken to be equal to 2. In this case, it is the second harmonic H2 of the output signal of the amplifier RFAMP that is the component the most proximate to the center frequency of the VCO.

Modelling a VCO

In accordance with an accepted theory and as shown in FIGS. 2A, 2B, a VCO can be modelled in the form of two elements A and B in closed loop, A being the active part of the VCO, modelled by a gain transconductance amplifier Gi, B being the reactive part of the VCO, modelled by a resistor, a capacitor and an inductor in parallel, i.e., an impedance F ($\omega$) of value:

$$F(\omega)=(1/R+1/(j\omega L)+j\omega C)^{-1} \quad (1)$$

When the VCO is balanced (switch SWP open in FIG. 2A), the equation of the closed loop is written:

$$V1=V1\ Gi\ F(\omega) \quad (2)$$

i.e.:

$$Gi=1/F(\omega) \quad (3)$$

To obtain stable oscillation conditions, the center frequency $\omega 1$ of the VCO must be equal to:

$$\omega 1=1/\sqrt{LC} \quad (4)$$

The result is that: Gi=1/R

First Disturbing Phenomenon: Frequency Jumps in the VCO

A first phenomenon that deteriorates the performances of the VCO in the presence of a spurious signal is a jump of the center frequency F1 of the VCO. This spurious signal appears when the various elements of the modulation circuit are activated, which is shown schematically in FIG. 2A by the closing of a switch SWP. The center frequency F1 is then offset towards a frequency F2 of pulsation $\omega 2$ and the frequency jump $\Delta F$ can be written:

$$\Delta F=(\omega 2-\omega 1)/2\pi \quad (5)$$

When the VCO is combined with a PLL circuit, as shown in FIG. 1, the frequency jump is compensated by the PLL circuit which brings the VCO back to its original center frequency. The frequency jump then results in instantaneous frequency jumps $\Delta F$ (t).

This phenomenon has been observed by applying voltage pulses to the mixer circuits IMIX and QMIX. The frequency $F_{BB}$ of the baseband is then zero and the harmonic H2 of the signal RFSx is equal to the natural frequency F1 of the VCO:

$$K=2 \text{ and } F_{BB}=0 \Rightarrow H2=2F_{RF}+2*0 \Rightarrow H2=2F_{RF}=F1 \quad (6)$$

As shown in FIG. 3, it can then be seen that the voltage V1 delivered by the VCO has frequency jumps upon each pulse sent on the channels IQ. The frequency jumps are due to the instantaneous activation of the spurious paths and the slow re-establishment of the original frequency by action of the phase locked loop. The amplitude of the voltages applied to the channels I and Q determines the phase and the amplitude of the output signal RFSx and therefore of the disturbing harmonic H2 reinjected into the VCO.

The frequency jumps can be characterised mathematically with reference to the VCO model described above and represented in FIG. 2A. By considering that the expression of the spurious signal is $Vsp*e^{j\phi}$ and that it has an amplitude Vsp and a phase $\phi$, the loop equation is as follows:

$$V1=V1GiF(\omega)+Vspe^{j\phi} \quad (7)$$

By considering now that the spurious signal is the output voltage V1 of the VCO that is reinjected into the core of the VCO by a spurious path having a transfer function $\alpha\ e^{j\Phi}$, when the switch SWP is closed, the loop equation can be written as:

$$V1=V1GiF(\omega)+V1\alpha e^{j\phi} \quad (8)$$

with:

$$\alpha=Vsp/V1 \quad (9)$$

By expressing the spurious transfer function in Cartesian coordinates:

$$b=Re(\alpha e^{j\phi}) \quad (10)$$

$$d=Im(\alpha e^{j\phi}) \quad (11)$$

the term $\omega 2$ can be found which meets the loop equation:

$$\omega 2 = \frac{1}{2}[d/(1-b)RC + \sqrt{[d/(1-b)RC]^2 + 4/LC}] \quad (12)$$

Therefore, it appears that the term "d" is zero and that the pulsation $\omega 2$ is equal to $\omega 1$ if the phase of the signal reinjected is zero in relation to the phase of the voltage V1 ($\phi=0$). In this case, the frequency jump $\Delta F$ is zero. If, on the contrary, $\phi=90°$ (maximum phase of the spurious signal) then b=0, d=$\alpha$ and:

$$\omega 2 = \frac{1}{2}[\alpha/RC + \sqrt{(\alpha/RC)^2 + 4/LC}] \quad (13)$$

i.e.:

$$\Delta F = [\frac{1}{2}[\alpha/RC + \sqrt{(\alpha/RC)^2 + 4/LC}] - \omega 1]/2\pi \quad (14)$$

These relations between the phase of the disturbing signal have been confirmed by computer simulations conducted using the VCO model. By simulating the injection into the VCO of a spurious signal of variable phase, a curve like the one represented in FIG. 4 could be traced. It can be seen on this Figure that the center frequency F1 of the VCO has jumps varying between two maxima +$\Delta$Fmax and −$\Delta$Fmax depending on the phase $\phi$ of the spurious signal, and has a zero value when the phase of the spurious signal is zero.

In fact, the equations allowing the frequency jumps to be characterised are confirmed by the experimental observations and by the computer simulations. It is therefore known as far as the frequency jumps are concerned that there is an exact concordance between the electrical characteristics (amplitude and phase) of the spurious signal that enters the core of the VCO and the disturbing phenomenon.

Second Disturbing Phenomenon: Spurious Lines in the Spectrum of Frequencies of the VCO This phenomenon is highlighted by applying for example to the channel I and the channel Q two pure sine curves of frequency $F_{BB}$ in phase quadrature. As represented in FIG. 5A, a single-sideband signal H1, of frequency $F_{RF}+F_{BB}$ (component H1) then appears at the output of the circuit TXCT. Harmonics H2, H3 . . . also appear. Traces of the carrier $F_{RF}$ and traces of the image signal $F_{RF}-F_{BB}$ that is neutralised or at least attenuated by the quadrature phase modulation can also be distinguished.

As K is here equal to 2, the harmonic H2 is the component of the modulated signal that is the most proximate to the center frequency F1 of the VCO. This harmonic of frequency $2F_{RF}+2F_{BB}$, i.e., F1+$2F_{BB}$, is reinjected into the VCO by spurious paths. By observing the output of the VCO by means of a spectrum analyser, the appearance, in addition to the signal V1 of frequency F1, of a spurious line SH2 of the same frequency as the harmonic H2 can be seen, as shown in FIG. 5B.

The appearance, to the left of the center frequency F1 of the VCO, of an image spurious line ISH2 of frequency $2F_{RF}-2F_{BB}$ (i.e., F1+$2F_{BB}$) can also be seen.

Figure 6B:
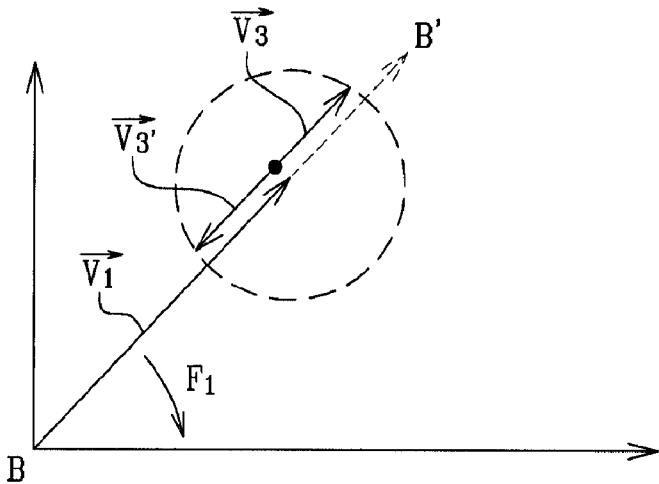

The presence of this line ISH2 can be explained in a manner shown in FIGS. 6A and 6B. A VCO is a system that, by design, is limited in amplitude and operates like a clipping amplifier in relation to the spurious signal. However, the spurious signal injected, of frequency F1+$2F_{BB}$, is the vector sum of a vector ↑V1 of frequency F1 and a phasor ↑V2 of frequency $2F_{BB}$. The amplitude of the vector ↑V1 is defined by the conditions of oscillation of the VCO and cannot be exceeded. Thus, the amplitude component of the phasor ↑V2 of frequency $2F_{BB}$ is removed by the VCO. As represented in FIG. 6A, the mechanism for removing the amplitude component transforms the phasor ↑V2 into a phasor ↑V2' oriented according to an axis AA' that is perpendicular to an axis BB' according to which the vector ↑V1 is oriented. The vectorial breakdown of this phasor ↑V2' gives two vectors ↑V3, ↑V3' of amplitude V2/2 in opposite phase and of respective frequencies $2F_{BB}$ and $-2F_{BB}$. Another phenomenon can be added that is due to the presence of the PLL circuit, which forces the spurious vector ↑V1+↑V3+↑V3' to be in phase with the central vector ↑V1 of the VCO. Thus, as shown in FIG. 6B, the phase of the vector resulting from the sum of the two vectors ↑V3, ↑V3' is kept constant and equal to that of the central vector ↑V1. It is therefore aligned with the rotating axis BB'. This phenomenon occurs in the bandwidth of the phase locked loop.

In summary, the existence of the image line ISH2 is due to the amplitude stresses and to the phase stresses that are exerted on the spurious modulation signal once the latter is injected into the VCO.

These disturbances are also represented on FIG. 5B, in which firstly a curve $\phi$noise representing the phase noise generated by the thermal agitation in the resistor of the VCO has been traced, and secondly a curve Cm described below representing the variations in the amplitude of each spurious line when the frequency $F_{BB}$ varies.

In real conditions of use, the signals I and Q in the baseband are not pure sine curves but complex digital signals the instantaneous frequency of which varies permanently inside the baseband. Consequently, the two spurious lines represented in FIG. 5B move constantly and a whole spectrum of spurious signals can be observed.

The amplitude of the two spurious lines has been measured experimentally for various values of the frequency $F_{BB}$ of the signals I and Q. The curve Cm represented in FIG. 5B is represented in greater detail in FIG. 7, and is traced here for a single spurious line SH2, ISH2. The horizontal axis of the drawing represents the logarithm of an offset frequency Foff equal to the difference between the frequency $2F_{BB}$ of the spurious line and the center frequency F1 of the VCO. The vertical axis is the amplitude of the spurious lines in dBc. This experimental drawing shows that the amplitude of the spurious lines SH2, ISH2 has a maximum when the frequency $2F_{BB}$ falls on the resonance frequency Fc of the loop PLL (which corresponds to the cut-off frequency of the loop filter LOOPF as modified by the loop gain). When the frequency $2F_{BB}$ increases above the frequency Fc, the amplitude of the spurious lines decreases with a slope of 20 db/decade. The curve Cm also decreases rapidly inside the bandwidth of the PLL circuit, since the spurious signal is rejected by the loop gain.

It is important to note that these observations confirm that it is sufficient to neutralise the disturbing effects of the harmonic the most proximate to the center frequency F1 of the VCO, the frequency of which is in the vicinity of the limits of the bandwidth of the VCO, since the disturbing effect of the higher-ranking harmonics is low due to the attenuation of 20 dB per decade.

It can also be noted that the amplitude of the harmonics decreases rapidly going towards the high-ranking harmonics. Therefore, in practice, the radio frequency modulation circuits that are the most sensitive to the injection pulling are the circuits in which K=2, for example the transmission circuits provided for the DCS network (Digital Cellular System). The transmission circuits for the GSM network ("Global System for Mobile Communication") have a K ratio generally equal to 4 and their voltage controlled oscillators are less sensitive to the influence of the harmonic of rank 4, which nonetheless remains problematic.

The phase noise observed in FIG. 5B can be characterised theoretically with reference to the diagram in FIG. 2B. According to an accepted theory, the natural phase noise of a VCO, in the absence of an external spurious signal, is generated by the thermal agitation of the resistor R of the VCO (reactive part F (ω)). The natural phase noise expressed in dBc/Hz (noise/carrier signal ratio in decibels, i.e., here a noise/amplitude ratio of the center frequency of the VCO) obeys the following relation:

$$\Phi out(\omega)=20 \log[(1/\sqrt{2})*(\sqrt{(4kTR)}V1 \text{ rms})/(1-F(\omega)/R)] \text{ dBc/Hz} \quad (15)$$

"V1rms" being the oscillation amplitude (in Volt rms) of the VCO in the absence of a spurious signal, k being the Boltzmann constant, T the temperature in Kelvin, and R the resistor of the reactive part F (ω) expressed in Ohms.

In other terms, the phase noise appears like the ratio between the amplitude of the thermal noise and the amplitude V1rms of the center frequency of the VCO seen through the transfer function F (ω).

By considering that the source of noise is a spurious signal injected into the VCO, and by designating its effective amplitude by "Vsprms" (in Volt rms), a similar reasoning shows that the phase noise Φout due to the injection of the spurious voltage (and which is therefore now rather a level of spurious line) obeys the following relation:

$$\Phi out(\omega off)=20 \log[\frac{1}{2}*(Vsprms/V1 \text{ rms})/(1-(F(\omega off)/R))]dBc \quad (16)$$

ωoff being the pulsation corresponding to the offset frequency Foff (Foff=F1−2$F_{BB}$ or F1+2$F_{BB}$ when K=2)

Figure 7:
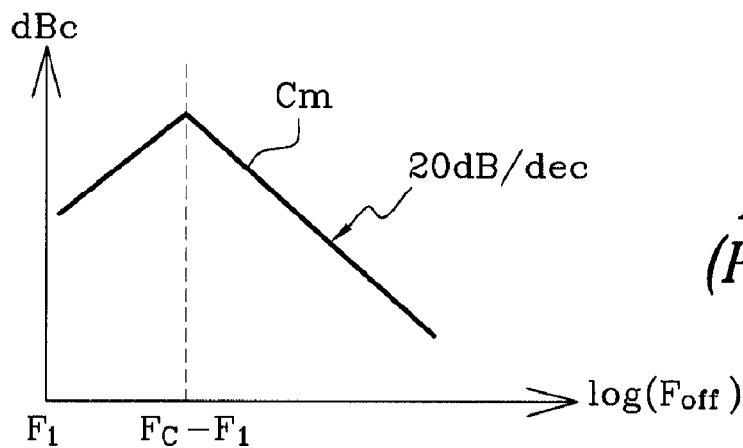
FIG. 7 represents a rejection curve of a spurious signal present in the voltage controlled oscillator in FIG. 1, FIG. 8 schematically represents a voltage controlled oscillator comprising a compensation circuit according to the present invention.

The relation 16 confirms the fact that the level of spurious line according to the offset frequency has a linear decrement of 20 dB per decade outside the bandwidth of the loop PLL, which has been experimentally observed above (FIG. 7).

By inverting the relation 16, the following is obtained:

$$Vsp(\Phi out)=2 10^{\Phi out/20} |1-(F(\omega)/R)|V1 \quad (17)$$

By measuring the level of spurious line Φout in dBc at the output of the VCO, it is possible to find out the level of the spurious signal (in effective voltage) entering the core of the VCO.

Conclusions About the Experimental and Theoretical Studies and Formulation of a Technical Problem To summarise the above, mathematical equations confirmed by experimental observations and by computer simulations, show that the two disturbing phenomena that are the frequency jumps and the spurious modulation (or phase noise) are attributable to a single cause taking the form of a spurious signal, of determined amplitude and phase.

Figure 8:
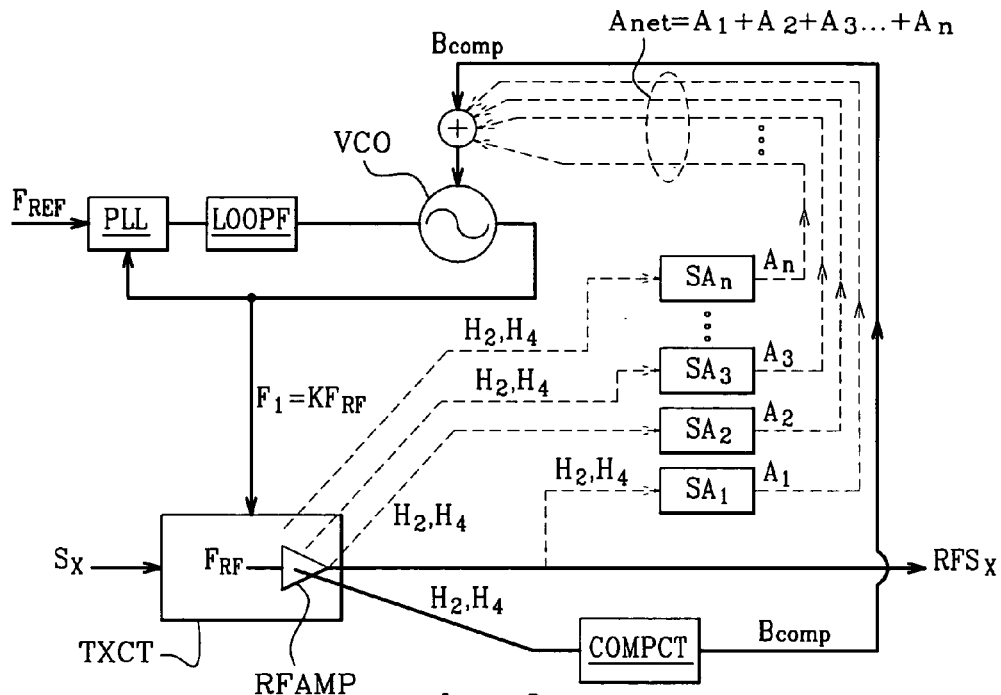

With reference to FIG. 8, a model of a technical problem and a model of a solution to this technical problem can therefore be formulated as follows: in the circuit represented in FIG. 8, the modulation stages IQ of the modulation circuit TXCT modulate a carrier $F_{RF}$ proportional to the center frequency F1 of the VCO, and more particularly equal to F1/2 (K=2) or to F1/4 (K=4) depending on the applications. The modulated signal passes in a modulation circuit produced with real components and therefore inevitably imperfect, and thus has a slight non-linearity imperfection. The output signal delivered by a non-linear circuit can be modelled by a polynomial:

$$F(t)=b0+b1\times(t)+b2\times(t)^2+b3\times(t)^3+b4\times(t)^4 \quad (18)$$

i.e.:

$$F(t)=b0+H1+H2+H3+H4+ \quad (19)$$

b0 being the DC offset of the output signal, H1 being the fundamental or wanted part of the output signal and b1 the gain on the wanted signal, H2 being the second harmonic and b2 the amplitude of the second harmonic, etc.

Harmonics are thus generated and at least one harmonic falls within the bandwidth of the VCO and disturbs its operation, which corresponds to an injection of a spurious signal. The spurious harmonic that disturbs the VCO the most is the one that is the most proximate to the oscillation frequency of the VCO, i.e., the harmonic H2 when K=2 or the harmonic H4 when K=4 . . . .

The spurious harmonic is propagated to the core of the VCO by many spurious paths (magnetic induction, electromagnetic radiations, paths passing through the substrate, paths passing through the power supply lines . . . ) each having their own transfer function, represented in FIG. 8 by blocks SA1, SA2, SA3 . . . SAn.

Whatever the number of spurious paths, the spurious signals A1, A2, A3 . . . An are added up and there is therefore one resulting spurious signal Anet that is the result of the vector sum of the vectors A1, A2 . . . An and which has a determined amplitude and phase:

$$Anet=A0ej\phi \quad (20)$$

General Features of the Method According to the Present Invention

According to the present invention, provision is thus made to inject into the VCO a spurious signal forming a compensation signal Bcomp, having the same amplitude as the signal Anet but in opposite phase with the signal Anet (i.e., a phase angle of 180°), such that Anet+Bcomp=0.

The signal Bcomp is delivered by a compensation circuit COMPCT according to the present invention, to which a determined signal is applied at input. The circuit COMPCT adjusts the phase and the amplitude of the determined signal that is supplied to it at input, to obtain the compensation signal Bcomp. Various examples of embodiments of this circuit will be described below.

The determined signal to be supplied to the circuit COMPCT must correspond in frequency to the harmonic H2 or H4 the disturbing effects of which are to be neutralised. As it will be understood from the examples below, it is advantageous for this signal to be the disturbing harmonic itself, which is easy to extract from the output stages of the modulation circuits, such as certain points of the output amplifier RFAMP for example that are rich in harmonics.

It should be noted that, in certain applications, it can happen that a node rich in harmonics H2 or H4 is not available or is not accessible. In this case, a harmonic generating circuit will be produced, by taking off in the circuit TXCT the carrier signal RFSx after the modulation stages (i.e., the modulated signal $F_{RF}$) and by applying this signal to non-linear components.

Figure 9:
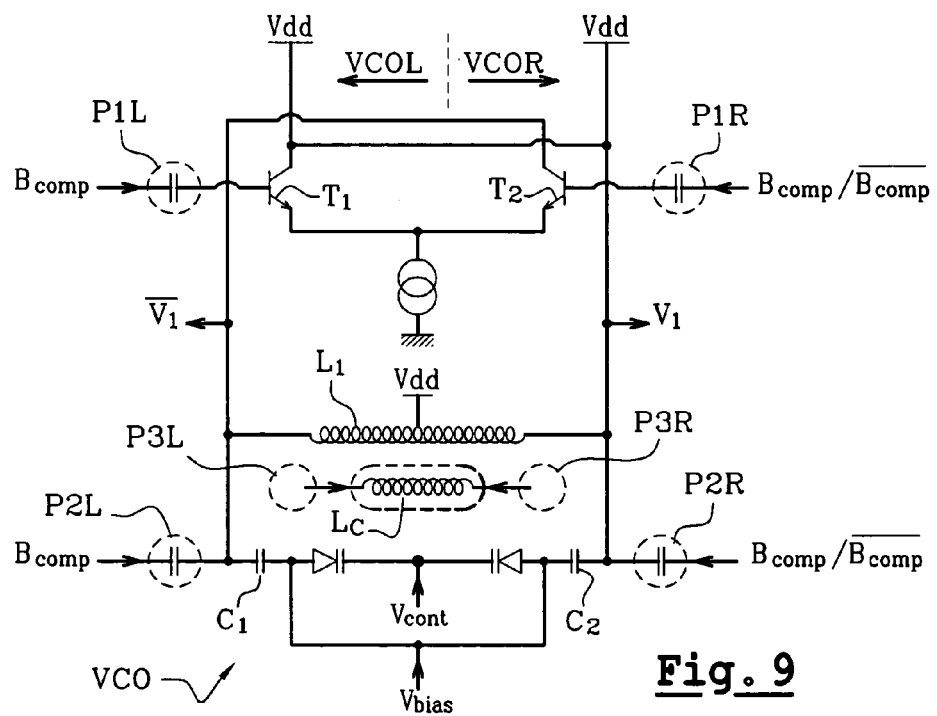
FIG. 9 is the partial wiring diagram of a classical voltage controlled oscillator, on which points of injection of a compensation signal according to the present invention are marked.

Finally, the point of injection of the compensation signal into the VCO must also be determined. Various options can be provided and reference will be made as an example to FIG. 9, which is the partial wiring diagram of a classical VCO. This VCO is here of the balanced type and has a left part VCOL ("VCO left") and a right part VCOR ("VCO righ") that operate in opposite phase for the generation of the output signal V1. Various points P1L, P1R, P2L, P2R, P3L, P3R of injection of the compensation signal Bcomp are represented by circles in dotted lines.

The signal Bcomp can be injected onto active component control terminals, such as onto bases of bipolar transistors T1, T2 (points P1L or P1R) for example through a capacitor aiming to avoid the introduction of a spurious DC signal. The signal Bcomp can also be injected onto terminals of passive components, such as cathodes of capacitors C1, C2 (points P2L, P2R) for example, the anodes of which receive a bias voltage Vbias. The injection of the signal Bcomp can also be carried out by inductive coupling, by means of an injection inductor Lc coupled with an inductor L1 of the VCO for example. The signal Bcomp is then applied to one of the ends of the inductor Lc (points P3L, P3R) the other end being grounded.

Now various examples of embodiments of a compensation circuit according to the present invention will be described. In the following description, it will be assumed, as above, that the compensation signal aims to neutralise the disturbing effects of the second harmonic H2 of the modulated signal delivered by the circuit TXCT.

Examples of Compensation Circuits

Figure 10:
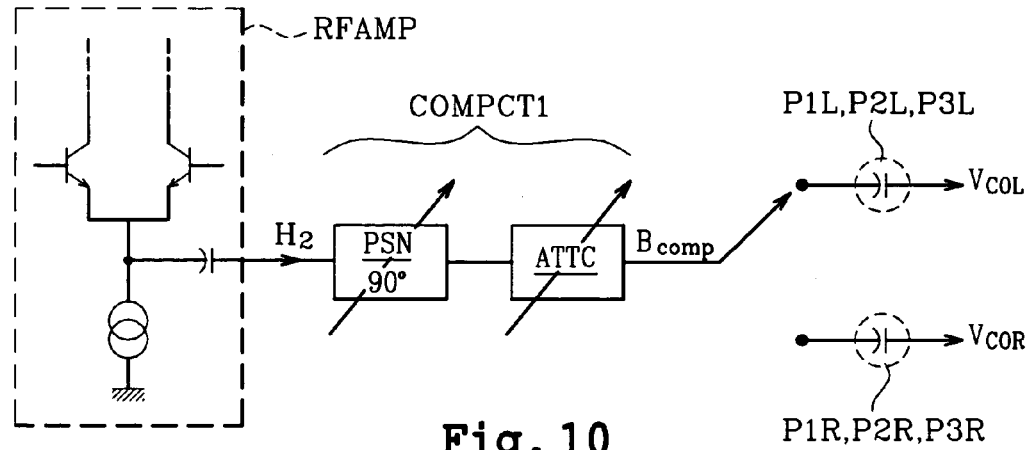
FIG. 10 represents in block form a first embodiment of a compensation circuit according to the present invention.

FIG. 10 represents a first embodiment of a compensation circuit COMPCT1 according to the present invention. The circuit COMPCT1 comprises a phase shift network PSN receiving the harmonic H2 at input. The output of the circuit PSN is applied to an amplitude attenuator ATTC. The output of the attenuator ATTC delivers the signal Bcomp and is applied to the part VCOL or to the part VCOR of the VCO, at one point of injection to be chosen for example out of the points of injection P1L/P1R, P2L/P2R, P3L/P3R described above.

The harmonic H2 is taken off at one node of the output amplifier RFAMP rich in harmonics and that does not have the fundamental H1 (wanted signal), such as at one emitter node of two bipolar transistors for example, and through a capacitor aiming to remove any DC offsets of the signal present on this node.

Figure 11:
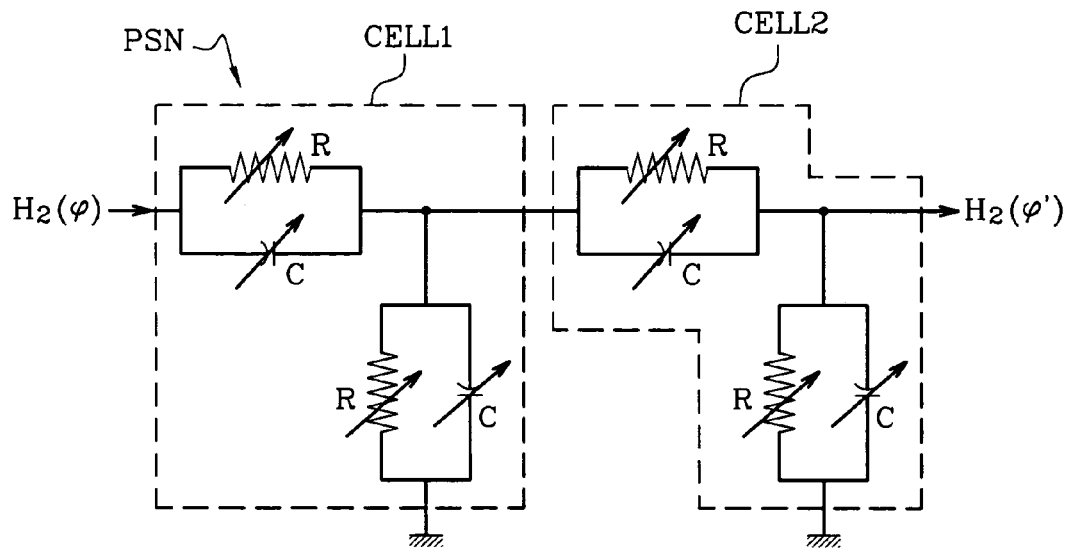
FIG. 11 is the wiring diagram of a phase control element represented in block form in FIG. 10.

As represented in FIG. 11, the circuit PSN comprises one or two cells RC in series, here two cells CELL1, CELL2. Each cell CELL1, CELL2 comprises a first group RC formed by a capacitor and a resistor that are adjustable in parallel in series with a second group RC also formed by a capacitor and a resistor adjustable in parallel. The output point of each cell is the midpoint of the two groups RC. Depending on the value given to these elements, the circuit PSN enables the desired phase lead or lag to be applied to the harmonic H2. Therefore, the harmonic H2 taken off with a determined phase φ in the amplifier RFAMP is delivered by the circuit PSN with a corrected phase φ'.

Figure 12:
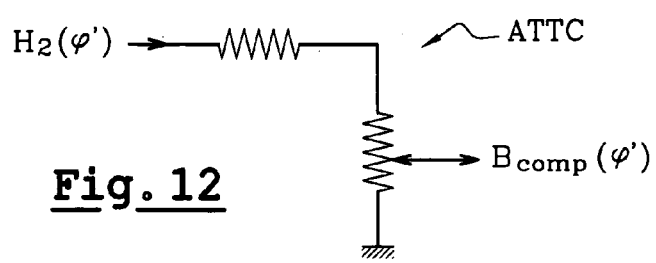
FIG. 12 is the wiring diagram of an amplitude control element represented in block form in FIG. 10.

As represented in FIG. 12, the attenuator circuit ATTC is for example an adjustable resistive dividing bridge, that corrects the amplitude of the harmonic H2 (φ') to deliver the signal Bcomp (φ').

The circuits PSN and ATTC are adjusted during an electric test step prior to commissioning the circuit RFCT. The phase and amplitude values are adjusted empirically by applying test signals to the circuit RFCT, until the output of the VCO delivers a "clean" signal without the spurious phenomena described above, obviously as far as is possible and within the limits of the accepted tolerances, since a total neutralisation of the disturbing effects is in practice very unrealistic.

This embodiment of the compensation circuit according to the present invention is preferentially intended to be implemented in the form of a discrete component circuit. Now, with reference to FIGS. 13 and 17, two other embodiments COMPCT2, COMPCT3 of the compensation circuit according to the present invention will be described that are provided to be preferentially implemented in an RF integrated circuit.

The compensation circuits represented in these Figures are digitally adjustable and the adjustment values, once determined, are recorded in a register NVREG. The outputs of the register NVREG are applied to a digital to analog converter DAC with several ways, that delivers a plurality of analog signals to electrically adjustable capacitors of the VARICAP type.

Figure 13:
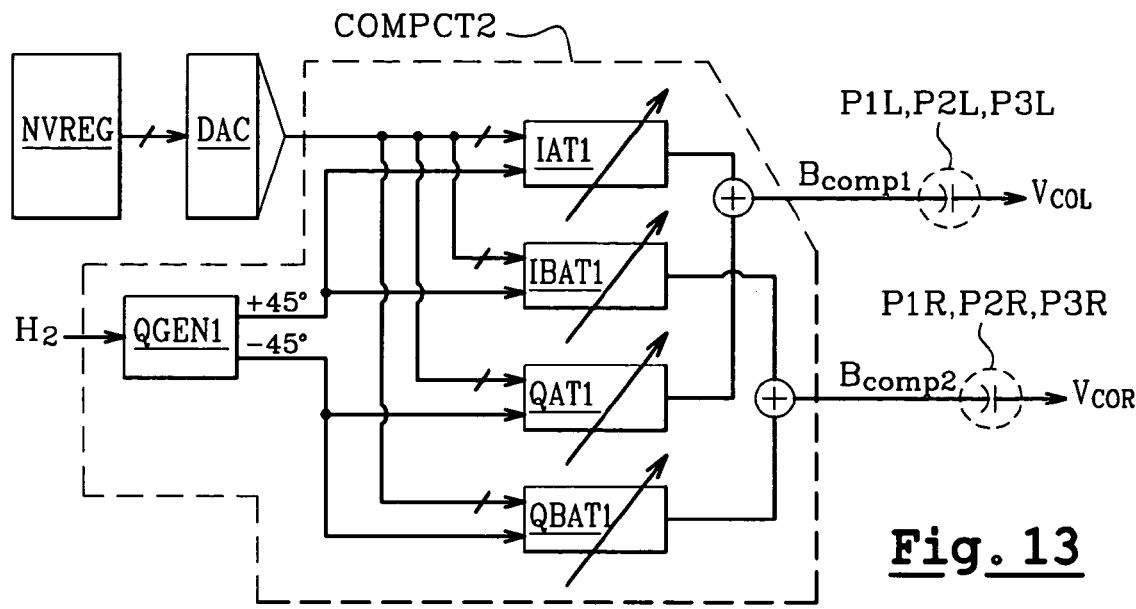
FIG. 13 represents in block form a second embodiment of a compensation circuit according to the present invention.

The circuit COMPCT2 represented in FIG. 13 is of the single ended type and receives the harmonic H2 at input, which is taken off in the manner described above. The circuit COMPCT2 comprises a quadrature generator QGEN1 and four phase-shifters/attenuators IAT1, IBAT1, QAT1, QBAT1 driven by the outputs of the converter DAC. These are pure attenuators that control four sine-wave signals, respectively I, IB (or /I, i.e., I shifted by 180°), Q (sine curve in quadrature with I) and QB (or /Q, i.e., Q shifted by 180°). The sum of the four sine curves gives a new sine curve having an amplitude and a phase that is the result of the vector sum of the four signals.

The generator QGEN1 respectively delivers, to two distinct outputs, the harmonic H2 phase-shifted by +45° and the harmonic H2 phase-shifted by −45°. The harmonic H2 phase-shifted by +45° is applied to the attenuators IAT1 and IBAT1 while the harmonic H2 phase-shifted by −45° is applied to the attenuators QAT1 and QBAT1. The outputs of the attenuators IAT1 and QAT1 are added up to form a signal Bcomp1 that is applied to the part VCOL of the VCO, at one of the points of injection P1L, P2L or P3L described above. The outputs of the attenuators IBAT1 and QBAT1 are added up to form a signal Bcomp2 that is applied to the part VCOR of the VCO, at one of the points of injection P1R, P2R, P3R described above.

Figure 14:
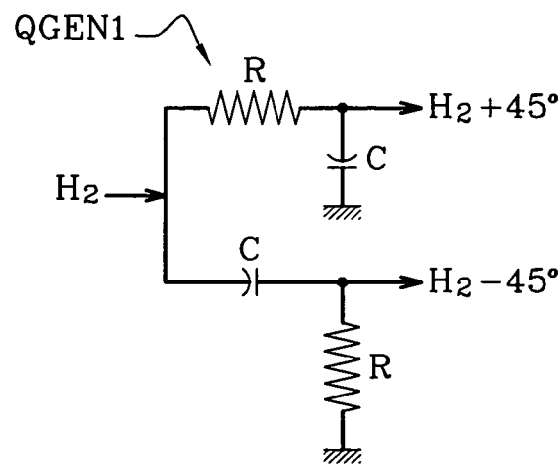
FIG. 14 is the wiring diagram of a quadrature signal generator represented in block form in FIG. 13.

As shown in FIG. 14, the quadrature generator QGEN1 comprises for example a cell RC that phase shifts the harmonic H2 by +45° and a cellule CR in parallel with the cell RC, that phase shifts the harmonic H2 by −45°.

Figure 15:
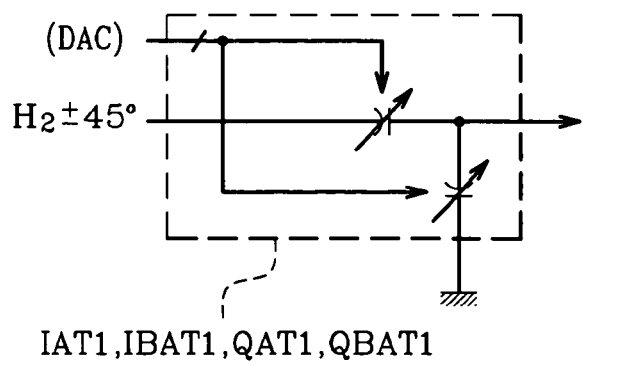
FIG. 15 is the wiring diagram of an amplitude control element represented in block form in FIG. 13.

As shown in FIG. 15, each attenuator IAT1, IBAT1, QAT1, QBAT1 comprises a capacitive dividing bridge formed by two VARICAP capacitors each driven by an output of the converter DAC, said output delivering a DC signal required to control these elements. The bias system of the VARICAP capacitors is well known by those skilled in the art and will not be described for the sake of simplicity.

Figure 16:
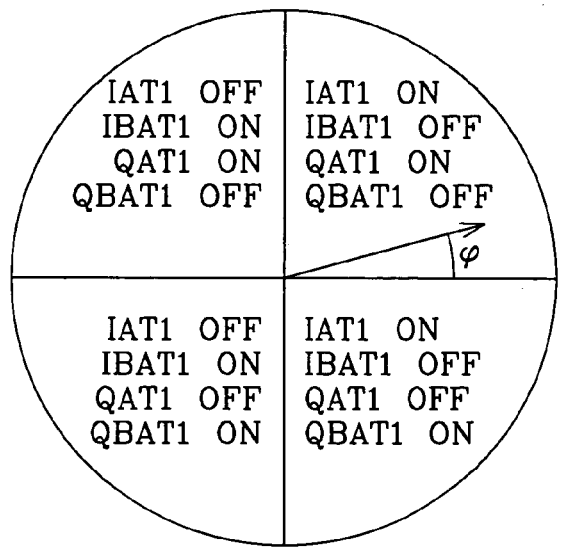
FIG. 16 is a phase diagram showing the operation of the compensation circuit in FIG. 13.

FIG. 16 is a phase diagram with four dials showing the phase and amplitude correction range provided by the attenuators according to the present invention. When the attenuators IAT1 and QAT1 are active and the attenuators IBAT1, QBAT1 are deactivated (high impedance state), the phase of the signal Bcomp is adjustable within the limits of the first dial, i.e., between 0 and 90°, and the amplitude of the signal Bcomp is determined by the ratio between the values of the capacitors that form each attenuator. When the attenuators IBAT1 and QAT1 are active and the attenuators IAT1, QBAT1 are deactivated, the phase of the signal Bcomp is adjustable within the limits of the second dial, i.e., between 90° and 180°. When the attenuators IBAT1 and QBAT1 are active and the attenuators IAT1, QAT1 are deactivated, the phase of the signal Bcomp is adjustable within the limits of the third dial, i.e., between 180° and 270°. When the attenuators IAT1 and QBAT1 are active and the attenuators IAT1, QAT1 are deactivated, the phase of the signal Bcomp is adjustable within the limits of the fourth dial, i.e., between 270° and 0°.

Figure 17:
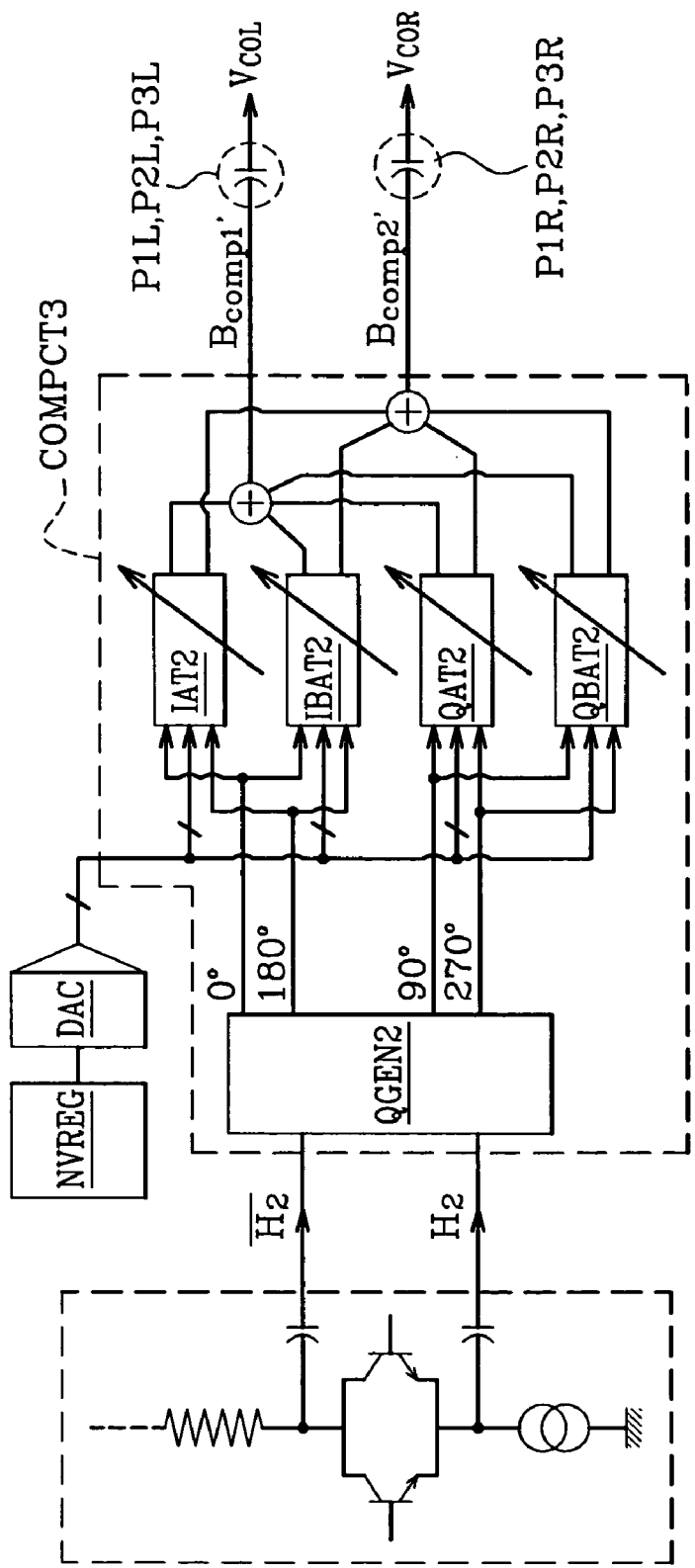
FIG. 17 represents in block form a third embodiment of a compensation circuit according to the present invention.

The circuit COMPCT3 represented in FIG. 17 is of the balanced type and receives at input, in addition to the harmonic H2, a harmonic /H2 phase-shifted by 180°. The harmonic H2 is taken off as described above on an emitter node of two transistors of the amplifier RFAMP. The harmonic /H2 is taken off on a collector node of the same transistors.

The circuit COMPCT3 comprises a balanced-type quadrature generator QGEN2 and four phase-shifters attenuators IAT2, IBAT2, QAT2, QBAT2 driven by the converter DAC, each comprising a first and a second output. The generator QGEN2 receives the harmonics H2, /H2 and respectively delivers, to four distinct outputs, the harmonic H2 phase-shifted by 0°, by +90°, by +180° and by +270°. The harmonics H2 phase-shifted by 0° and by 180° are both applied to the attenuators IAT2 and IBAT2. The harmonics H2 phase-shifted by 90° and 270° are both applied to the attenuators QAT2 and QBAT2.

The first outputs of the attenuators IAT2, IBAT2, QAT2, QBAT2 are added up to form a signal Bcomp1' that is applied to the part VCOL of the VCO, at one point of injection P1L, P2L or P3L. The second outputs of the attenuators IAT2, IBAT2, QAT2, QBAT2 are added up to form a signal Bcomp2' in opposite phase with Bcomp1', which is applied to the part VCOL of the VCO, at one point of injection P1R, P2R or P3R.

Figure 18:
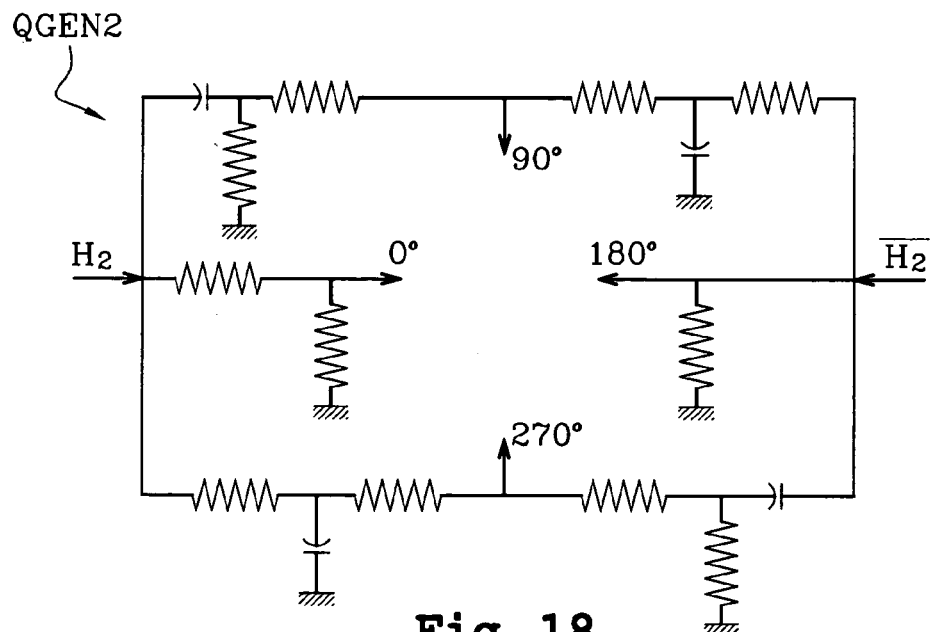
FIG. 18 is the wiring diagram of a quadrature signal generator represented in block form in FIG. 17.

As shown in FIG. 18, the generator QGEN2 comprises a balanced bridge of capacitors and resistors, in which the variations in temperature and process (variations in the characteristics of the elements with the manufacturing process) are reduced. Therefore this generator ensures a relative phase shift of 90° between each of its outputs, whatever the variation of the resistors and capacitors with the temperature or with the manufacturing process, and the working frequency F1.

The generator QGEN2 can also be produced in the form of a POLYPHASE filter, so as to further reduce the effects of variations in temperature, process and working frequency.

Figure 19:
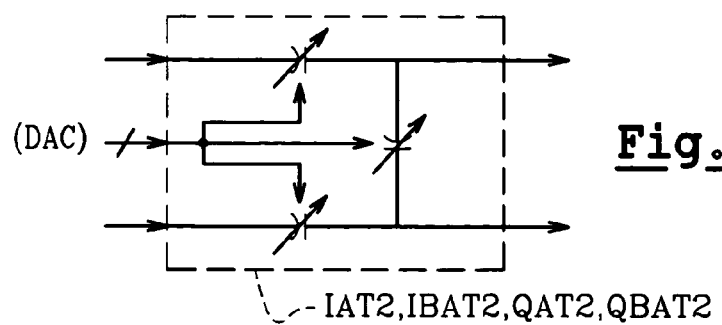
FIG. 19 is the wiring diagram of an amplitude control element represented in block form in FIG. 17.

As shown in FIG. 19, each attenuator IAT1, IBAT1, QAT1, QBAT1 comprises a balanced capacitive dividing bridge with two inputs and two outputs, formed by three adjustable VARICAP capacitors each driven by one output of the converter DAC delivering a bias voltage. As above, the control of the bias voltages of the adjustable VARICAP capacitors will not be described for the sake of simplicity. The first adjustable capacitor is arranged between the first input and the first output. The second adjustable capacitor is arranged between the second input and the second output. The third adjustable capacitor is arranged between the two outputs.

The operation in phase and amplitude of the compensation circuit COMPCT3 is similar in principle to the circuit COMPCT2 described above, and offers the added advantage of being less sensitive to the variations in temperature and process and of being more accurate.

It will be understood by those skilled in the art that various other alternatives and embodiments of the present invention may be made like the generation of active quadrature, the use of POLYPHASE filter . . . Moreover, electrically adjustable resistors may be used instead of the VARICAP capacitors.

Although the description above focuses mainly on describing a compensation circuit of the disturbing effects of a harmonic of second or of fourth rank, the scope of application of the present invention is obviously not limited to these examples, as K may be equal to 1 (frequency of the VCO equal to the frequency RF), to 4, etc. Furthermore, although it was considered at the end of experimental observations and theoretical calculations that it is sufficient in practice to neutralise the effects of a noise having a single origin, which is the result of the vector sum of the signals delivered via all the spurious paths, it goes without saying that certain applications or certain circuit architectures may require compensating the disturbing effects of spurious signals of different origins (sent, for example, before or after a variable gain amplifier). In this case, two compensation signals must be provided, and it is preferable for each noise of different origin to be treated by a dedicated compensation circuit. In this case, two or more independently adjustable compensation signals, which can be added up upstream from their point of injection, are injected into the VCO.

Finally, although the present invention has been described above in relation with a phase modulation IQ circuit, it goes without saying that the scope of application of the present invention also relates to the other modulation circuits, particularly amplitude modulation AM circuits and phase and amplitude modulation circuits, which also generate spurious harmonics.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An RF circuit comprising:
a voltage controlled oscillator to deliver an RF signal;
a phase locked loop to control the voltage controlled oscillator;
a modulation circuit to receive the RF signal and to deliver a modulated signal having at least one harmonic component of a frequency equal or proximate to that of the RF signal delivered by the voltage controlled oscillator, the harmonic component being capable of disturbing operation of the voltage controlled oscillator by injection pulling;
an injection pulling compensation circuit, having one input to receive at least the disturbing harmonic component and means for modifying a phase and an amplitude of the harmonic component to deliver an injection pulling compensation signal; and
means for injecting the compensation signal into the voltage controlled oscillator.

2. The RF circuit according to claim 1 wherein the compensation circuit is amplitude and phase adjustable such that the compensation signal injected into the voltage controlled oscillator has an amplitude substantially equal to an amplitude of a spurious signal resulting from involuntary injection into the voltage controlled oscillator, by at least one spurious path, of the disturbing harmonic component, and a phase opposite that of the spurious signal.

3. The RF circuit according to claim 1 wherein the compensation circuit is a single ended circuit that delivers a compensation signal having a unique component that is injected at one point of the voltage controlled oscillator.

4. The RF circuit according to claim 1 wherein the compensation circuit is a single ended circuit that delivers a compensation signal having two components that are injected at two different points of the voltage controlled oscillator.

5. The RF circuit according to claim 1 wherein the compensation circuit is a balanced circuit that delivers a compensation signal having two components in opposite phase that are injected at two different points of the voltage controlled oscillator.

6. The RF circuit according to claim 1 wherein the compensation circuit receives at input a harmonic component taken off the modulation circuit.

7. The RF circuit according to claim 6 wherein the compensation circuit receives at input a harmonic component taken off an output amplifier of the modulation circuit.

8. The RF circuit according to claim 1 wherein the compensation circuit receives at input a harmonic component delivered by a harmonic generating circuit distinct from the modulation circuit.

9. The RF circuit according to claim 1 wherein the compensation circuit comprises a phase-shift circuit to modify the phase of the harmonic component received at input.

10. The RF circuit according to claim 1 wherein the compensation circuit comprises a phase-shift circuit to receive the disturbing harmonic component and to deliver two phase quadrature signals.

11. The RF circuit according to claim 1 wherein the compensation circuit comprises a phase-shift circuit to receive the disturbing harmonic component and to deliver phase quadrature and opposite phase signals.

12. The RF circuit according to claim 11 wherein the phase-shift circuit comprises a balanced bridge of resistors and capacitors that is insensitive to temperature.

13. The RF circuit according to claim 1 wherein the compensation circuit comprises at least one attenuator circuit to modify the amplitude of the harmonic component received at input.

14. The RF circuit according to claim 13 wherein the attenuator circuit comprises adjustable resistors or capacitors or a combination of these elements.

15. The RF circuit according to claim 13 wherein said at least one attenuator circuit includes a group of at least two attenuator circuits having outputs that are added up to control a phase and an amplitude of the compensation signal.

16. The RF circuit according to claim 15 wherein said at least one attenuator circuit includes a group of attenuator circuits having outputs that are added up and that receive at input phase quadrature signals coming from the disturbing harmonic component.

17. The RF circuit according to claim 15 wherein said at least one attenuator circuit includes a group of attenuator circuits having their outputs that are added up and that receive at input phase quadrature and opposite phase signals coming from the disturbing harmonic component.

18. The RF circuit according to claim 15 wherein said at least one attenuator circuit comprises electrically adjustable capacitors or electrically adjustable resistors, which are adjusted by analog signals delivered by a digital to analog converter.

19. The RF circuit according to claim 18 wherein digital data to adjust the capacitors of the attenuator circuit are stored in memory cells and are applied to the digital to analog converter.

20. The RF circuit according to claim 1 wherein the compensation signal is injected onto one terminal of an active component of the voltage controlled oscillator.

21. The RF circuit according to claim 1 wherein the compensation signal is injected onto one terminal of a passive component of the voltage controlled oscillator.

22. The RF circuit according to claim 1 wherein the means for injecting the compensation signal comprise an injection inductor coupled to an inductor of the voltage controlled oscillator.

23. A method for stabilizing operation of a voltage controlled oscillator that sends an RF signal and is driven by a phase locked loop, the method comprising:

receiving through at least one spurious path a harmonic component of a frequency equal or proximate to that of the RF signal sent, said harmonic component being capable of disturbing the operation of the voltage controlled oscillator by injection pulling; and injecting, into a core of the voltage controlled oscillator, an injection pulling compensation signal, a frequency of which is within a bandwidth of the voltage controlled oscillator and a phase and an amplitude of which are adjustable so as to neutralize disturbing effects of the harmonic component.

24. The method according to claim 23 wherein the compensation signal is amplitude and phase adjusted so as to have said amplitude substantially equal to an amplitude of a spurious signal resulting from involuntary injection into the voltage controlled oscillator, by at least one spurious path, of the disturbing harmonic component, and said phase opposite that of the spurious signal.

25. The method according to claim 23 wherein said injecting the compensation signal includes a single ended injection, at one point of the voltage controlled oscillator, of said compensation signal having a unique component.

26. The method according to claim 23 wherein said injecting the compensation signal includes an injection of said compensation signal having two components, and includes a single ended injection of these components at two different points of the voltage controlled oscillator.

27. The method according to claim 23 wherein said injecting the compensation signal includes an injection of said compensation signal having two components in opposite phase, and includes an injection of these two components at two different points of the voltage controlled oscillator.

28. The method according to claim 23 wherein the compensation signal is generated from at least one harmonic component taken off a modulation circuit.

29. The method according to claim 28 wherein the compensation signal is generated from at least one harmonic component taken off in an amplifier of said modulation circuit, from which the disturbing harmonic component is sent.

30. The method according to claim 23 wherein the compensation signal is generated from one harmonic component produced by a harmonic generating circuit.

31. The method according to claim 23 wherein the phase of the compensation signal is adjusted by a phase-shift circuit.

32. The method according to claim 31 wherein the amplitude of the compensation signal is adjusted by an attenuator circuit having adjustable resistors or capacitors or a combination of these elements.

33. The method according to claim 23 wherein the amplitude and the phase of the compensation signal are adjusted by a group of at least two attenuator circuits having outputs that are added up.

34. The method according to claim 33 wherein the amplitude and the phase of the compensation signal are adjusted by said group of attenuator circuits having their outputs added up and receiving at input phase quadrature signals coming from the disturbing harmonic component.

35. The method according to claim 33 wherein the amplitude and the phase of the compensation signal are adjusted by said group of attenuator circuits having their outputs added up and receiving at input phase quadrature and opposite phase signals coming from the disturbing harmonic component.

36. The method according to claim 35 wherein the phase quadrature and opposite phase signals are generated by a phase-shift circuit having a balanced bridge of resistors and capacitors that is insensitive to temperature.

37. The method according to claim 33 wherein said at least two attenuator circuits includes an attenuator circuit having electrically adjustable capacitors or electrically adjustable resistors that are adjusted by analog signals coming from adjustment digital data.

38. The method according to claim 37 wherein the adjustment digital data are stored in memory cells.

39. The method according to claim 23 wherein the compensation signal is injected onto one terminal of an active component of the voltage controlled oscillator.

40. The method according to claim 23 wherein the compensation signal is injected onto one terminal of a passive component of the voltage controlled oscillator.

41. The method according to claim 23 wherein the compensation signal is injected by inductive coupling.

42. A method for stabilizing operation of a voltage controlled oscillator that sends an RF signal and is driven by a phase locked loop, the method comprising:
receiving through at least one spurious path a harmonic component of a frequency equal or proximate to that of the RF signal sent, said harmonic component being capable of disturbing the operation of the voltage controlled oscillator by injection pulling; and
injecting, into the voltage controlled oscillator, an injection pulling compensation signal having a phase and an amplitude that are adjustable so as to neutralize disturbing effects of the harmonic component,
wherein said injecting the compensation signal includes injecting said compensation signal having two components at two different points of the voltage controlled oscillator.

43. The method of claim 42 wherein said injecting is a single ended injection.

44. The method of claim 42 wherein said injecting the compensation signal having two components includes injecting the compensation signal having the two components in opposite phase, at two different points of the voltage controlled oscillator.

45. A method for stabilizing operation of a voltage controlled oscillator that sends an RF signal and is driven by a phase locked loop, the method comprising:
receiving through at least one spurious path a harmonic component of a frequency equal or proximate to that of the RF signal sent, said harmonic component being capable of disturbing the operation of the voltage controlled oscillator by injection pulling;
injecting, into the voltage controlled oscillator, an injection pulling compensation signal having a phase and an amplitude that are adjustable so as to neutralize disturbing effects of the harmonic component; and
adjusting said phase of the compensation signal using a phase-shift circuit.

46. The method of claim 45, further comprising generating the compensation signal from one harmonic component produced by a harmonic generating circuit.

47. The method of claim 45 wherein said injecting the compensation signal includes injecting the compensation signal onto one terminal of an active component of the voltage controlled oscillator.

* * * * *